(12) United States Patent
Maier et al.

(10) Patent No.: US 8,724,682 B2
(45) Date of Patent: May 13, 2014

(54) METHOD FOR CARRYING OUT BIDIRECTIONAL COMMUNICATIONS

(75) Inventors: Gert Maier, Reutlingen (DE); Claus Moessner, Ispringen (DE)

(73) Assignee: Robert Bosch GmbH, Stuttgart (DE)

( * ) Notice: Subject to any disclaimer, the term of this patent is extended or adjusted under 35 U.S.C. 154(b) by 1112 days.

(21) Appl. No.: 12/584,792

(22) Filed: Sep. 10, 2009

(65) Prior Publication Data

US 2010/0296614 A1   Nov. 25, 2010

(30) Foreign Application Priority Data

Oct. 8, 2008 (DE) .......................... 10 2008 042 680

(51) Int. Cl.
*H04B 3/46* (2006.01)
*H04L 7/00* (2006.01)

(52) U.S. Cl.
USPC .......................................... 375/224; 375/355

(58) Field of Classification Search
USPC ................................................ 375/355, 354
See application file for complete search history.

(56) References Cited

U.S. PATENT DOCUMENTS

| | | | |
|---|---|---|---|
| 2003/0048811 A1* | 3/2003 | Robie et al. | 370/509 |
| 2005/0058234 A1* | 3/2005 | Stojanovic | 375/371 |
| 2006/0159204 A1* | 7/2006 | Karthik et al. | 375/340 |
| 2008/0294925 A1* | 11/2008 | Ohno | 713/375 |
| 2009/0077426 A1* | 3/2009 | Liberty | 714/45 |
| 2009/0225669 A1* | 9/2009 | Qin et al. | 370/249 |

* cited by examiner

*Primary Examiner* — Chieh M Fan
*Assistant Examiner* — Brian J Stevens
(74) *Attorney, Agent, or Firm* — Kenyon & Kenyon LLP

(57) ABSTRACT

In a method for carrying out bidirectional communications between a first electronic unit and a second electronic unit, a clock signal and an input signal synchronized with the clock signal are transmitted from the first electronic unit to the second electronic unit, and the second electronic unit transmits a response sequence in an output signal to the first electronic unit. In addition, an unambiguous test sequence is generated in the second electronic unit and transmitted to the first electronic unit prior to the response sequence in the output signal, a time sequence between the test sequence and the response sequence in the output signal making it possible to take into account a time delay between the first electronic unit and the second electronic unit.

17 Claims, 10 Drawing Sheets

I # METHOD FOR CARRYING OUT BIDIRECTIONAL COMMUNICATIONS

BACKGROUND OF THE INVENTION

1. Field of the Invention

The present invention relates to a method for carrying out bidirectional communications between one first electronic unit and at least one second electronic unit.

2. Description of Related Art

In bidirectional communications between electronic units, an input signal or command signal is normally transmitted from one first electronic unit known as "tool" to at least one second electronic unit which may be referred to as "target." This input signal is synchronized with an internal clock pulse of the first electronic unit; to recognize a signal level, it should be ensured that the edge of the clock signal is in the middle of the signal, so that the latter may be reliably recognized and read.

The receiving, second electronic unit generates an output signal from the received input signal, which is in turn transmitted to the first electronic unit. The clock signal of the first electronic unit, which is also received, is used in the second electronic unit. However, only the generated output signal is now transmitted back to the first electronic unit, where the received output signal is analyzed using the internal clock pulse.

The problem is that considerable delays, whose magnitude is often unknown, may occur due to the circuit systems provided between the units. These delays, which may also be different for different signals, may be a function of external conditions such as, for example, temperature, and may result in the time shift of the internal clock pulse with respect to the received output signal being such that the output signal may no longer be reliably detected and analyzed.

BRIEF SUMMARY OF THE INVENTION

The present invention provides a method for carrying out bidirectional communications between one first electronic unit and at least one second electronic unit, in which a clock signal and an input signal synchronized therewith are transmitted from the first electronic unit to the at least second electronic unit, and the second electronic unit transmits a response sequence, generated in response to the input signal, in an output signal to the first electronic unit, an unambiguous test sequence being generated in the second electronic unit, which is transmitted to the first electronic unit prior to the response sequence in the output signal, a time sequence between test sequence and response sequence in the output signal making it possible to take into account a time delay between the first electronic unit and the at least one second electronic unit.

In an example embodiment, the test sequence in the output signal is detected by the first electronic unit and in this way the response sequence is recognized in the output signal. This is possible because the time sequence between test sequence and response sequence is known. Therefore, it is known in what time interval with respect to the test sequence the response sequence is transmitted in the output signal.

It may be provided that the output signal is sampled using a multiple of the clock pulse which is also transmitted together with the clock signal. This allows the test sequence to be rapidly recognized. The clock pulse, using which the response sequence is subsequently analyzed, is selected or adjusted to the response sequence taking the test sequence into account.

In an example embodiment, the time delay between the first electronic unit and the at least one second electronic unit is measured in the method.

The communication may take place via a JTAG (Joint Test Action Group) interface.

The test sequence includes, for example, at least one status change. This means that the test sequence is given by the level value sequence 01 or 10, for example.

An electronic unit for carrying out the method according to the present invention has a device for generating a response sequence in response to the input signal and a test sequence as well as for combining the test sequence with the response sequence.

The present invention also relates to a computer program having program code means for executing all steps of the above-described method when this computer program is executed on a computer or an appropriate arithmetic unit, in particular in an electronic unit as described above.

The computer program product according to the present invention having program code means which are stored on a computer-readable data medium is provided for executing all steps of the method according to the present invention when the computer program is executed on a computer or an appropriate arithmetic unit, in particular in an electronic unit as described above.

In the method presented, the output signal or the TDO signal may thus be separated from the clock signal or TCK signal on the tool side. Instead of the synchronization between TDO and TCK signals provided in the related art, the test sequences or synchronization bits impressed on the TDO signal also occur. This results in two advantages, namely that the clock rate of all signals may be significantly increased, and that even for an unchanged clock rate, the communication takes place more sturdily against sporadic delays due to buffer or driver components in the signal transmission.

It is to be taken into account, in particular, that compatibility with the related art is ensured. Existing tools ignore the additional synchronization with the TDO signal because up to that point no information is transmitted there and they may therefore continue to be operated using the previous clock frequency.

It is understood that the above-named features to be elucidated below are usable not only in the given combination, but also in other combinations or by themselves without leaving the scope of the present invention.

DETAILED DESCRIPTION OF THE INVENTION

Figure 1:
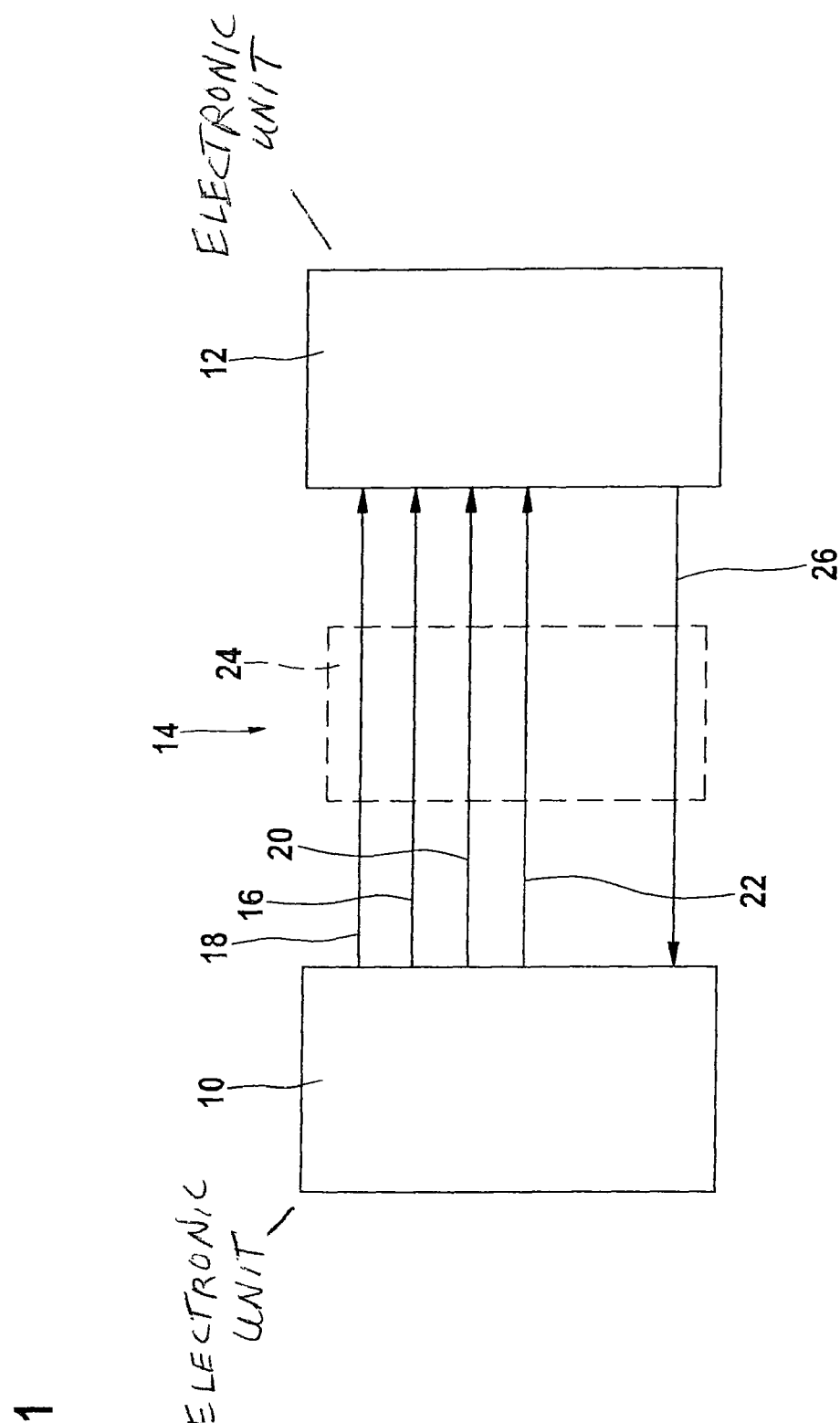
FIG. 1 shows a system having one first electronic unit and one second electronic unit for carrying out the method according to the present invention.

FIG. 1 shows one first electronic unit 10 and one second electronic unit 12, which are provided for bidirectional communications and are connected via a JTAG interface 14 for this purpose. First electronic unit 10 is labeled as tool and second electronic unit 12 is labeled as target. This second electronic unit 12 may be a microcontroller in a control unit, for example.

First electronic unit 10 as the so-called master controls the communication via JTAG interface 14 and generates a clock signal 16 (TCK signal), a reset signal 18 (TRST signal), a test mode select signal 20 (TMS signal, i.e., test mode select signal), and an input signal 22 (TDI signal), and transmits them to second electronic unit 12. It is to be taken into account here that the above-mentioned signals are subject to a time delay, which is indicated in the illustration by a delay block 24 (delay).

Second electronic unit 12 represents the so-called slave and performs requested actions such as read and write sequences, for example. Second electronic unit 12 transmits an output signal 26 (TDO signal) to first electronic unit 10. Furthermore, second electronic unit 12 may use additional signals for displaying or signaling. Note that second electronic unit 12 uses the clock pulse of first electronic unit 10.

The delay between first electronic unit 10 and second electronic unit 12 is influenced by the length of the line between units 10 and 12 and possibly by additional electronic devices provided therebetween. This results in delays in the signal transmission, whose magnitude is routinely unknown. Since received output signal 26 of second electronic unit 12 is detected and analyzed in first electronic unit 10 using the internal clock pulse, this may result in output signal 26 not being recognized or being erroneously interpreted.

Figure 2:
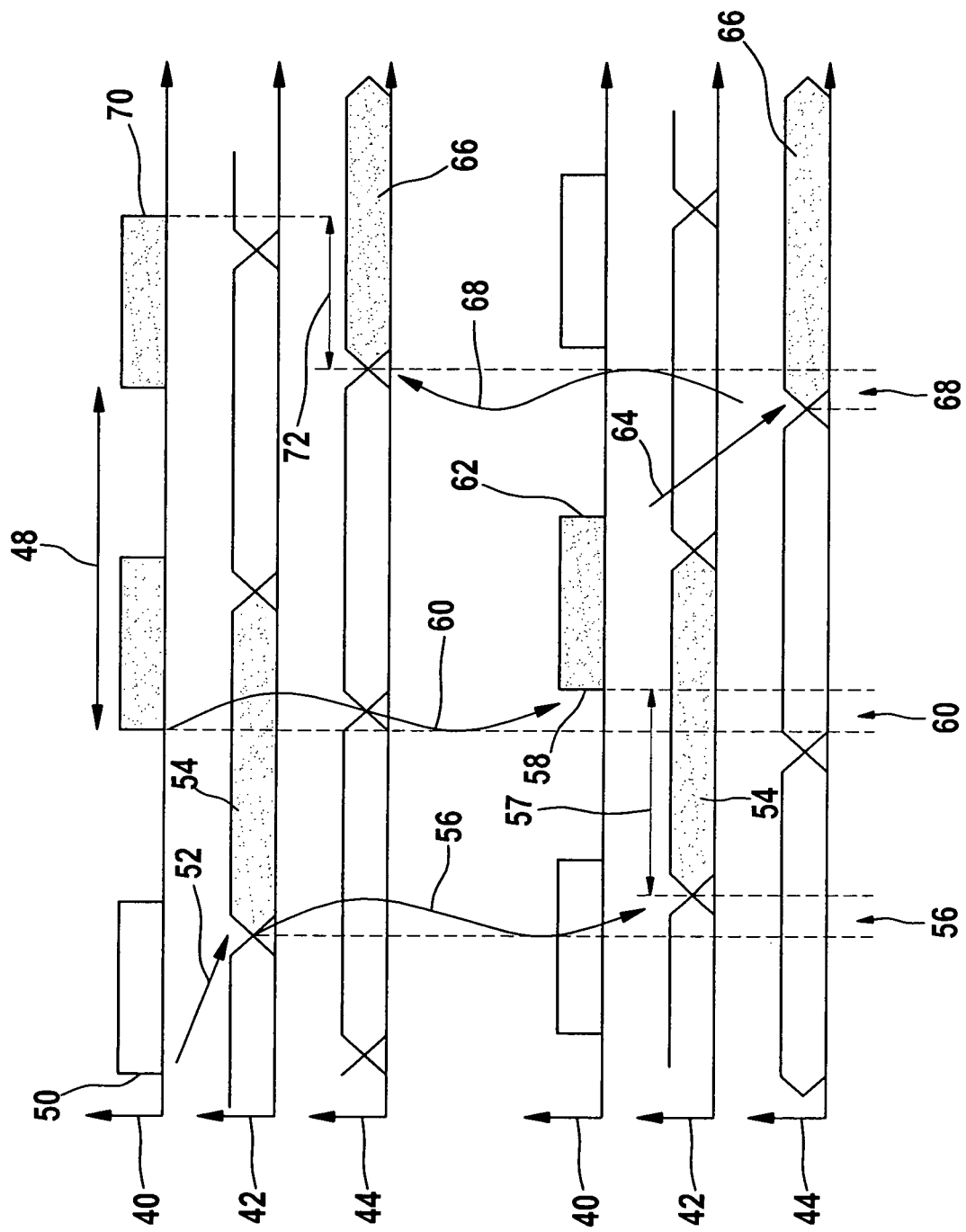
FIG. 2 shows curves of the signals transmitted in bidirectional communications according to the related art.

FIG. 2 shows signal curves in a bidirectional communication. The top illustration shows the curves on the tool side, namely a clock signal 40, an input signal 42, and a received output signal 44. The bottom illustration shows, on the target side, clock signal 40, input signal 42, and output signal 44. A double arrow 48 illustrates the clock pulse period.

A rising edge 50 of the clock signal causes a signal value 54 to be triggered, delayed by a period $t_{CO\_A}$ 52, in input signal 42, which is transmitted to the target and received there delayed by a time period 56. This input signal 42 is recognized, after a time period $t_{SU\_B}$ 57, at the target with a rising edge 58, this rising edge also occurring shifted by a time delay 60 compared with the tool side. A response sequence or output sequence 66 is generated with falling edge 62 after a time period 64 $t_{CO\_B}$ and transmitted to the tool side. This output sequence 66 in output signal 44 is received on the tool side after a delay 68. This output sequence 66 is detected on the tool side with a falling edge 70 of clock signal 40 after a time period 72 $t_{SU\_A}$.

The illustration shows that output sequence 66 may still be correctly detected and recognized on the tool side. This is possible due to period 48 of clock signal 40, which has been selected relatively long compared to actual delays 56, 60, and 68. The illustration also shows that delays 56, 60, and 68 delimit the maximum clock frequency at which error-free communication between tool and target is still possible.

Figure 3:
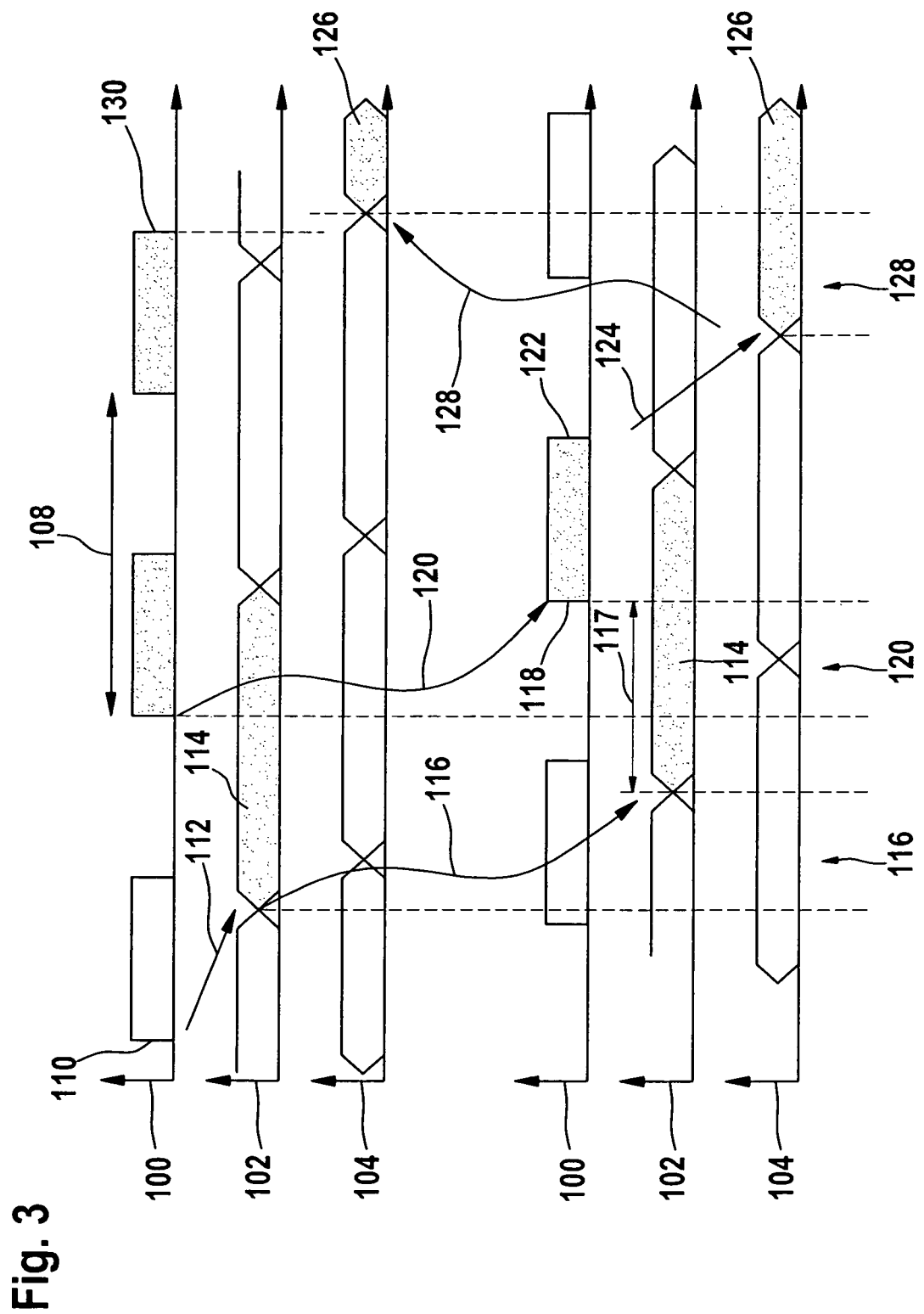
FIG. 3 shows other curves of signals transmitted in bidirectional communications according to the related art.

FIG. 3 again shows signal curves in a bidirectional communication, the curves on the tool side, namely a clock signal 100, an input signal 102, and a received output signal 104 being shown on the top. On the target side, clock signal 100, input signal 102, and output signal 104 are shown on the bottom of the illustration. A double arrow 108 illustrates the clock pulse period.

A rising edge 110 of clock signal 100 causes a signal value 114 to be triggered in input signal 102, delayed by a period $t_{CO\_A}$ 112, which is transmitted to the target and received there delayed by a time period 116. This signal value 114 is recognized, after a time period $t_{SU\_B}$ 117, at the target with a rising edge 118, this rising edge 118 also occurring shifted by a time delay 120 compared with the tool side. An output sequence 126 is generated with falling edge 122" after a time period 124 $t_{CO\_B}$ and is transmitted to the tool side. This output sequence 126 in output signal 104 is received on the tool side after a delay 128. This output sequence 126 may no longer be detected on the tool side with a falling edge 130 of clock signal 100.

The tool thus generates the TMS signal and the TDI signal, based on clock signal 100, with a delay of $t_{CO\_A}$ and makes these signals available to the target. Normally, the TMS signal and the TDI signal are generated at a rising edge of the TCK signal. All signals are transmitted via a transmission path and reach the target with a certain delay. The differences in the delays of the individual signals are normally negligible.

The target detects the signals using the received clock pulse, i.e., samples the signals using the clock pulse. A defined setup time $t_{SU\_B}$ is required for error-free sampling.

The target generates the TDO signal, based on the TCK signal, with a delay of $t_{CO\_B}$, and makes this signal available to the tool. The TDO signal is normally generated at a falling edge of the TCK signal. The TDO signal is transmitted to the tool via the transmission path and is received there with a certain delay. The tool samples the TDO signal using the clock pulse, a defined setup time $t_{SU\_A}$ being necessary for error-free sampling.

The time delay between tool and target is usually non-critical if the differences between the time delays of different signals, i.e., the differences in the propagation times of the individual signals, are negligible. The time relationship between TCK, TMS, and TDI remains unaffected by the delay. This means that, if the required setup time $t_{SU\_B}$ is complied with on the tool side, this is also the case for the target.

The transmission path between target and tool represents the critical path. Assuming the time delay to be the same for both transmission paths, the following equation results:

$$t_{CO\_B} + t_{SU\_A} + 2*\text{delay} < TCK$$

The clock pulse period must therefore be greater than the total time delay in order to ensure an error-free process. The frequency of the clock pulse and thus of the entire interface is therefore limited. When the time delay is fixed and known, the tool may sample the TDO signal using a delayed clock pulse. However, if the delay is variable or unknown, this presents a serious problem.

The proposed method is useful in this case. It allows higher frequencies in the data transmission, in particular in the case of a JTAG interface. Furthermore, sturdiness is improved, even in the case of considerable delays. These time delays occur, for example, due to long transmission paths and interconnected buffers. A deviation or drift of the time delay may also be caused by temperature effects. The method makes a dynamic adjustment to different transmission paths and varying temperatures possible.

Figure 4:
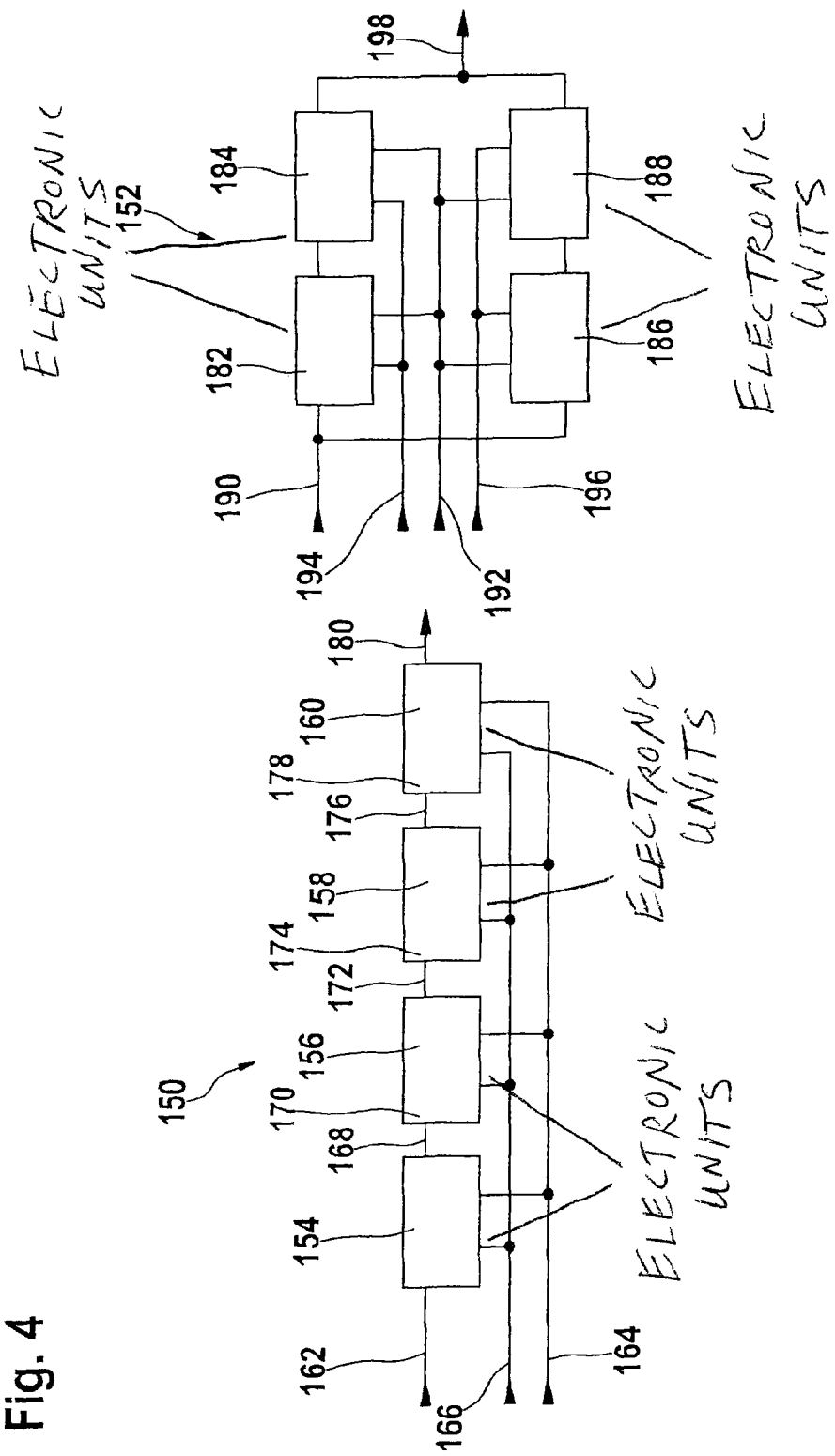
FIG. 4 shows possible configurations of the JTAG standard.

FIG. 4 shows possible embodiments of the JTAG standard. A first embodiment 150 shows a serial configuration, and a second embodiment 152 shows a mixed serial-parallel configuration.

In serial configuration 150, four electronic units 154, 156, 158, and 160 are provided connected in series. An input signal 162 TDI, together with a clock signal 164 TCK and a test mode select signal 166, are input into first electronic unit 154. An output signal 168 TDO of first electronic unit 154 represents an input signal 170 TDI for second electronic unit 156. Output signal 172 TDO of second electronic unit 156 is input signal 174 for third electronic unit 158. Output signal 176 TDO of third electronic unit 158 represents input signal 178 of fourth electronic unit 160. Output signal 180 TDO of fourth electronic unit 160 is output signal 180 TDO of the entire configuration 150. Clock signal 164 and test mode select signal 166 are each supplied to electronic units 154 through 160 separately.

In second embodiment 152, four electronic units 182, 184, 186, and 188 are again provided, and are subdivided into two branches or groups, namely a first group having units 182 and 184, and a second group having units 186 and 188. Within the groups, units 182 through 188 are connected to each other in series. The two groups are arranged in parallel and are appropriately connected to each other.

A TDI 190 and a TCK 192 are used as input quantities. However, separate test mode select signals, namely a TMS 1 labeled with reference numeral 194 and a TMS 2 labeled with reference numeral 196, are provided for the two groups. TDO 198 is the output quantity.

The JTAG standard defines that the TDO signal is active only in the shift-IR and shift-DR states of the TAP controller and is inactive (high-impedance) in all other states. The illustrated method modifies the behavior of the TDO in some TAP states without impairing the functionality of the JTAG interface. In the serial configuration, all TAP controllers of each chain are in the same state, and the TDO is connected to the TDI of the adjacent unit. Switching TAP into a state other than the shift states has no effect.

In a parallel configuration, all TDOs and TDIs are connected to each other, but have separate TMS signals. Therefore, only one controller may be in the shift state and all other units may be held in the reset or idle state of the TAP controller. In these two states, namely reset and idle, the presented method proposes an unchanged behavior (high-impedance), so that only one active unit will output TDO.

This is also applicable to a mixed serial-parallel configuration as is illustrated in FIG. 4 and labeled with reference numeral 152.

Figure 5:
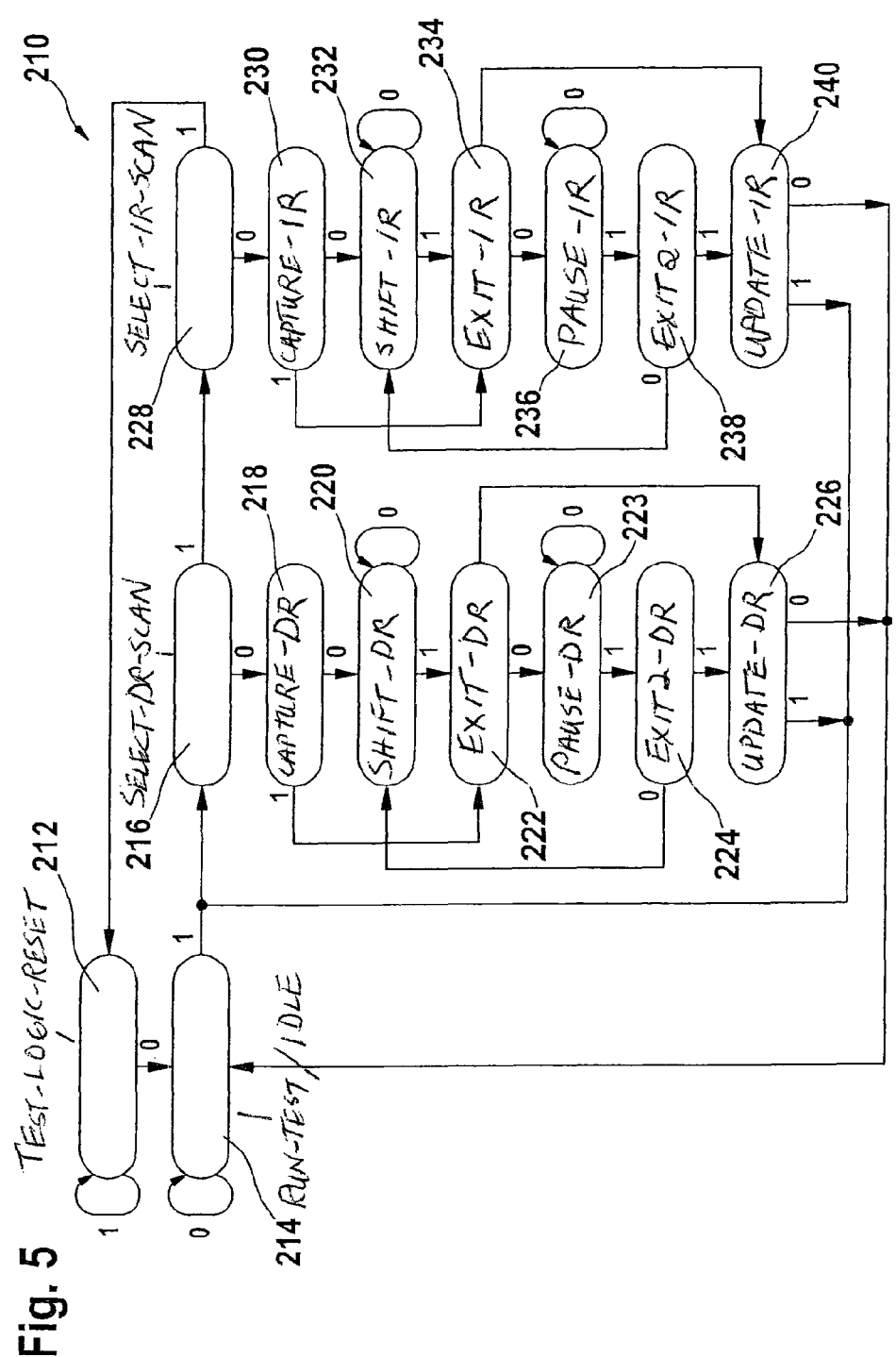
FIG. 5 shows a JTAG-TAP state machine in a state diagram.

FIG. 5 shows, in a state diagram, a JTAG-TAP state machine (TAP=test access port), which is labeled overall with reference numeral 210. This is a state machine whose transitions are controlled or caused by the TMS signal and which controls the behavior of the JTAG system.

The states are: test-logic-reset 212, run-test/idle 214, select-DR-scan 216, capture-DR 218, shift-DR 220, exit-DR 222, pause-DR 223, exit2-DR 224, update-DR 226, select-IR-scan 228, capture-IR 230, shift-IR 232, exit-IR 234, pause-IR 236, exit2-IR 238, and update-IR 240.

Figure 6:
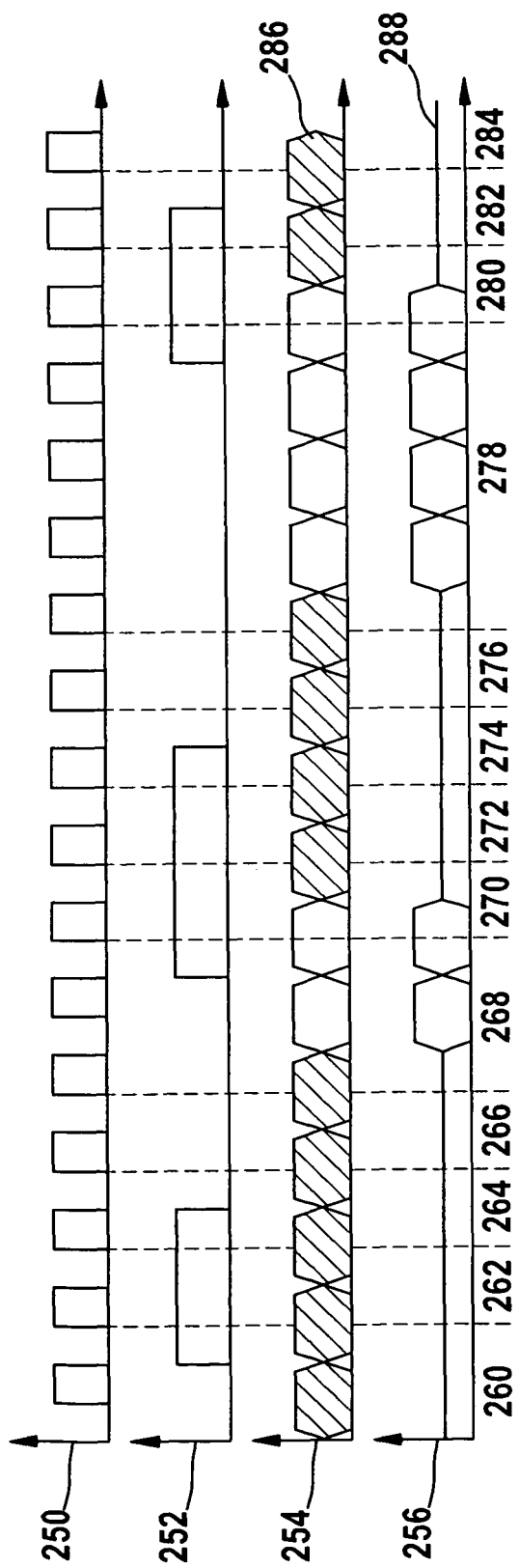
FIG. 6 shows a time sequence diagram of the JTAG-TAP state machine together with assigned states in a sequence according to the related art.

Signal curves and associated states of JTAG-TAP state machine 210 are shown in FIG. 6 in a time sequence diagram. The illustration shows the curve of a clock signal TCK 250, a test mode select signal TMS 252, an input signal TDI 254, and an output signal TDO 256. The illustration shows the behavior of the state machine during a sequence according to the related art.

Associated states are idle 260, select-DR 262, select-IR 264, capture-IR 266, shift-IR 268, exit1-IR 270, update-IR 272, select-DR 274, capture-DR 276, shift-DR 278, exit1-DR 280, update-DR 282, and idle 284.

Signal values 286 of TDI signal 254 drawn in dashed lines have no effect. A signal value 288 of TDO signal 256 reproduces a high-impedance state.

TMS signal 252 determines the sequence of the states of JTAG-TAP state machine 210. Different actions are performed in the specific, i.e., associated, states. A data exchange takes place in the shift-IR state and in the shift-DR state. TDO is thus operated actively only in these states.

The time sequence diagram of FIG. 6 shows a cycle through the IR and DR paths starting at and returning to the idle state. IR data include two bits and DR data include four bits. TDI must be valid at the rising edge of TCK. TDO is modified at the falling edge of TCK.

Figure 7:
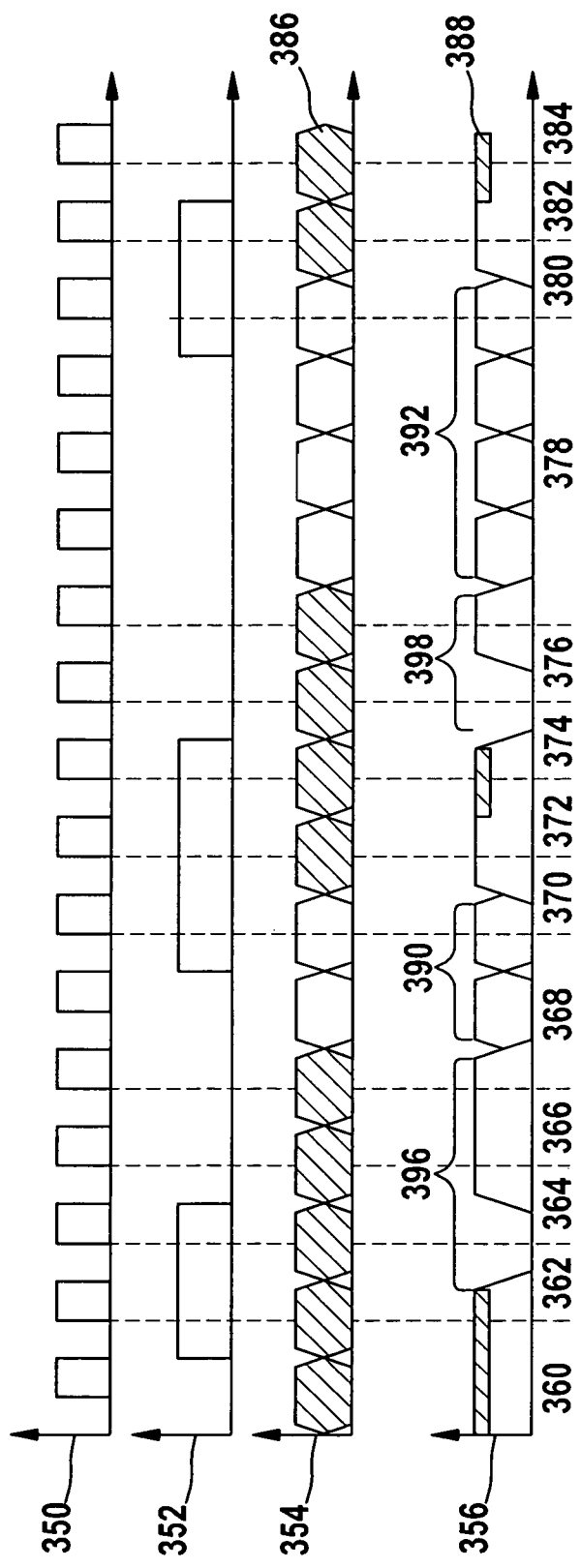
FIG. 7 shows another time sequence diagram of the JTAG-TAP state machine together with assigned states in a sequence according to the method of the present invention.

FIG. 7 shows another time sequence diagram of the JTAG-TAP state machine from FIG. 5.

The diagram shows the curve of clock signal TCK 350, a test mode select signal TMS 352, an input signal TDI 354, and an output signal TDO 356. The illustration shows the behavior of the state machine during a sequence according to the present invention.

Associated states are idle 360, select-DR 362, select-IR 364, capture-IR 366, shift-IR 368, exit1-IR 370, update-IR 372, select-DR 374, capture-DR 376, shift-DR 378, exit1-DR 380, update-DR 382, and idle 384.

Signal values 386 of TDI signal 254 drawn in dashed lines have no effect. A signal value 388 of TDO signal 256 reproduces a high-impedance state with pull-up behavior.

In the method according to the present invention, the JTAG-TAP state machine remains unchanged compared to the procedure according to the related art. TDO becomes active low during the select-DR state. During the states select-IR 364, capture-DR 376, capture-IR 366, exit1-IR 370, pause-DR, pause-IR, exit2-DR, exit2-IR, TDO is operated active high.

TDO remains high-impedance during the states reset, idle, update-DR, and update-IR. Furthermore, TDO shows a pull-up behavior during high-impedance states due to either an internal or an external pull-up resistor. The sequence shown in FIG. 6 then changes to the sequence shown in FIG. 7.

From FIG. 7 it is apparent that a test sequence 396 and 398 having a bit pattern 01 is included in the TDO signal prior to a response sequence 390 and 392. This unambiguous bit pattern is recognized by the tool. Since the time sequence between response sequence 390 and 392 and test sequence 396 and 398 is known, the tool recognizes when response sequences 390 and 392 are present in output signal TDO 356.

Figure 8:
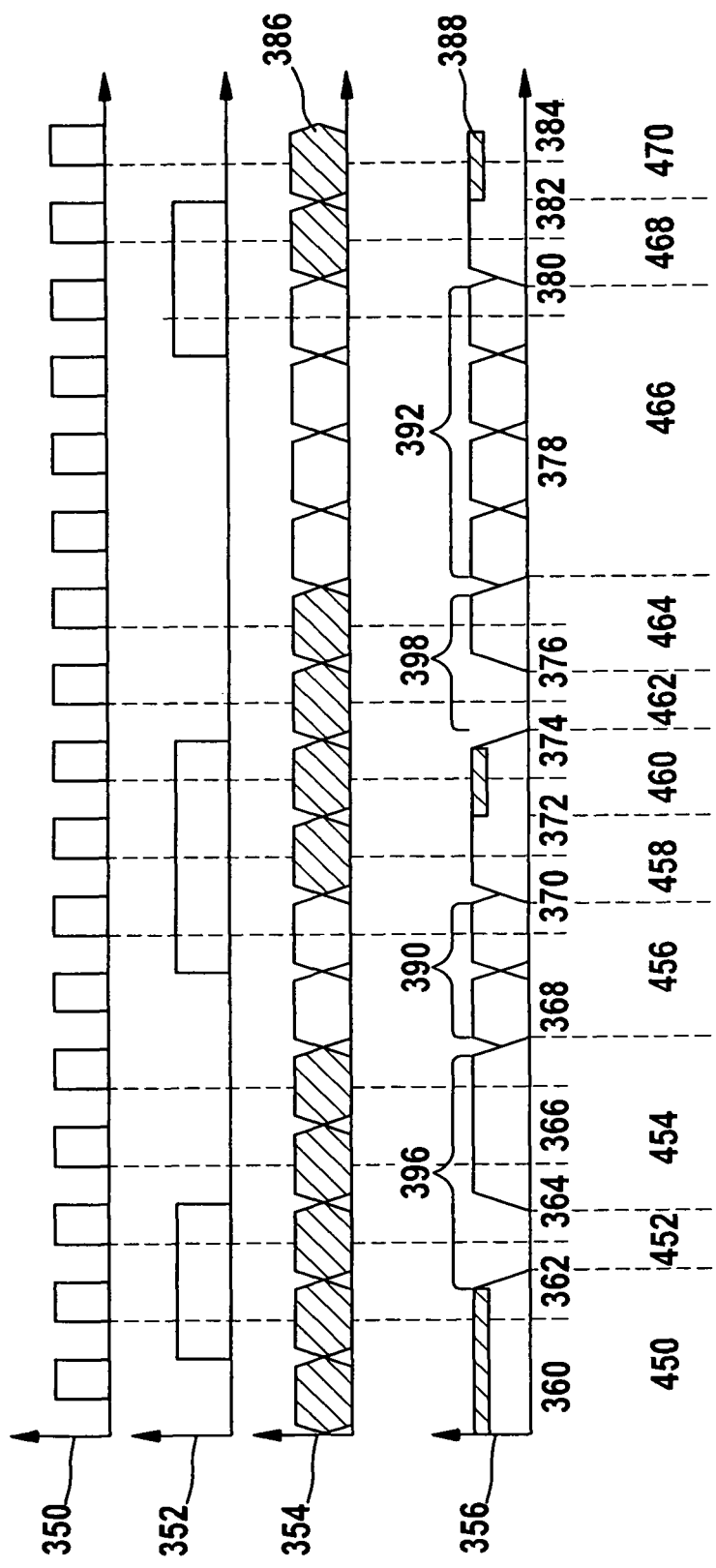
FIG. 8 shows a time sequence diagram from FIG. 7 supplemented by information regarding the behavior of the TDO signal.

FIG. 8 shows the time sequence diagram from FIG. 7, time ranges of different behaviors of TDO being additionally highlighted.

In a first range 450, TDO is high-impedance with pull-up. In a second range 452, TDO is pulled down as first bit value 0 of test sequence 396. In a third range 454, TDO is pulled up as second bit value 1 of test sequence 396. In a fourth range 456, TDO outputs data within response sequence 390. In a fifth range 458, TDO is pulled up. In a sixth range 460, TDO is high-impedance with pull-up. In a seventh range 462, TDO is pulled down within the scope of test sequence 398. In an eighth range 464, TDO is pulled up. In a ninth range 466, TDO outputs data. In a tenth range 468, TDO is pulled up. In an eleventh range 470, TDO is high-impedance with pull-up.

The method according to the present invention thus operates with only slight changes in the behavior of the TDO. Thus, for example, the behavior of the TDO during the update states may remain unchanged. In addition, the TDO is modified with a falling clock pulse edge. The above-described procedure provides that the TDO outputs a sequence or a pulse of definite length and definite level without affecting the JTAG-TAP state machine. The behavior of the interface in serial or parallel configuration and the tool remain unchanged. This facilitates the use of the above-presented method in existing systems.

It is of particular advantage that the TAP state machine does not have to be modified. It is possible to compensate for time delays, even if the magnitude of these delays is unknown. In the case of varying delays, dynamic compensation is possible.

Figure 9:
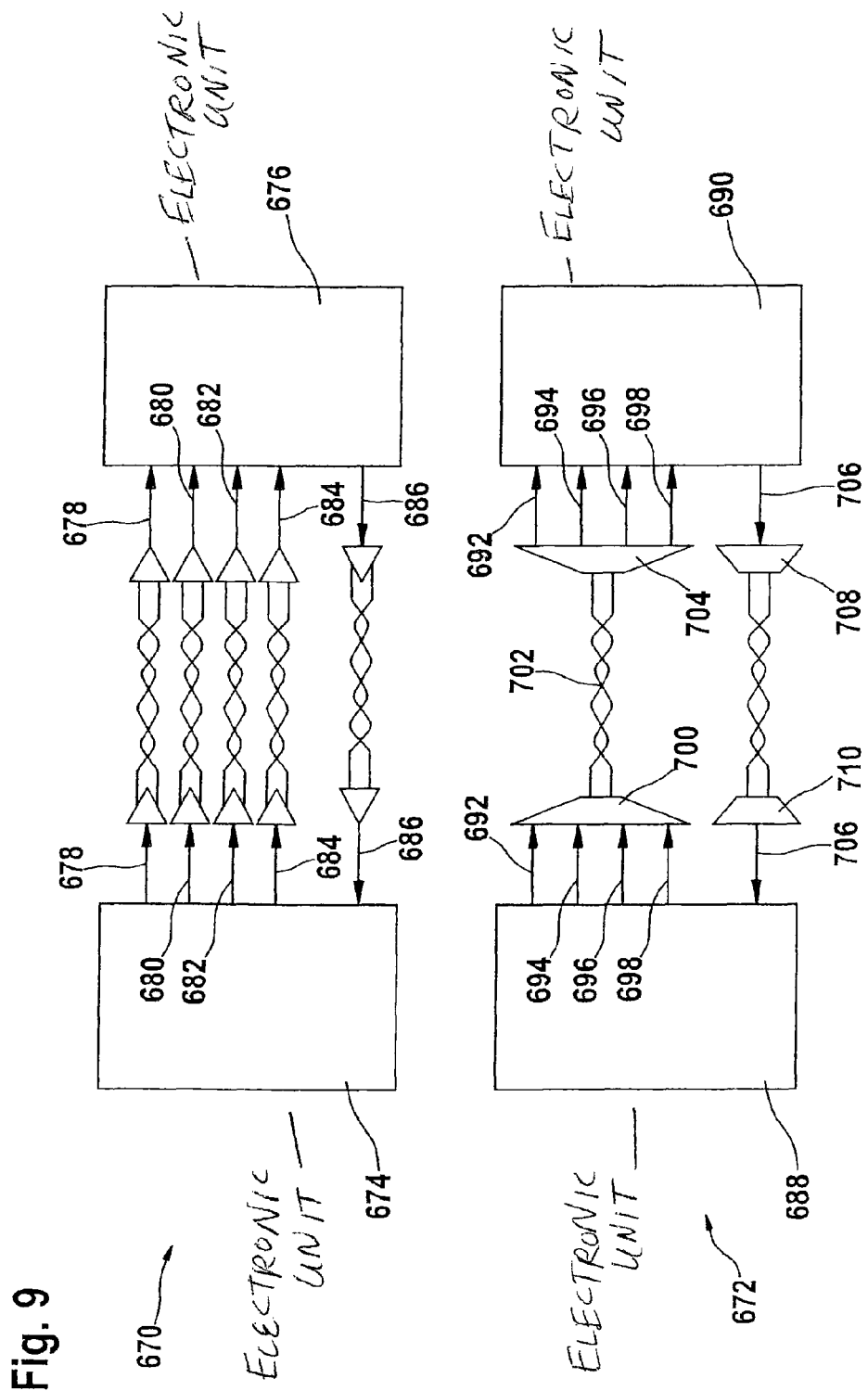
FIG. 9 shows two examples of transmission networks.

FIG. 9 shows two examples of transmission networks, a so-called LVDS (low-voltage differential signaling) transmission network 670 being shown on the top and a so-called SerDes (serializer/deserializer) network 672 being shown on the bottom.

LVDS network 670 has a first electronic unit 674, i.e., a tool, and a second electronic unit 676, i.e., a target. Tool 674 transmits a reset signal, i.e., a TRST signal 678, a clock signal, i.e., a TCK signal 680, a test mode select signal, i.e., a TMS signal 682, and an input signal, i.e., a TDI signal 684 to target 676.

The signals received over the network are processed in target 676 and a response sequence is generated in response to TDI signal 684, which is transmitted to tool 674 in an output signal, i.e., TDO signal 686.

The above-described method offers, at least in some of the described embodiments, a series of advantages. Thus, it is not necessary to modify the TAP state machine. The system may always be operated in a JTAG configuration, regardless of whether it is a serial or parallel configuration. The properties and performance of the JTAG interface are not impaired. No additional states or additional clock generators are needed. The sequence is comparable to the sequence illustrated in FIG. 6.

Switching to a modified tool is not necessary. Previously used tools are not affected by the novel behavior; they just ignore the novel TDO behavior and operate as previously up to a limited frequency and with limited transmission delays.

The novel procedure may compensate for the above-described delays, which is of advantage in particular in the case of unknown or varying delays. This makes the entire system sturdier.

SerDer transmission network 672 illustrated on the bottom of FIG. 9 also includes a first electronic unit 688, i.e., a tool, and a second electronic unit 690, i.e., a target. In this embodiment, a TRST signal 692, a TCK signal 694, a TMS signal 696, and a TDI signal 698 are output by tool 688 and are combined, i.e., bundled in a multiplexer or serializer 700 to form a combined signal 702. This combined signal 702 is unbundled again into the four output signals in a demultiplexer, i.e., deserializer 704. As a response to TDI signal 698, a TDO signal 706 is output by target 690, and is transmitted to tool 688 via a serializer 708 and a deserializer 710.

Figure 10:
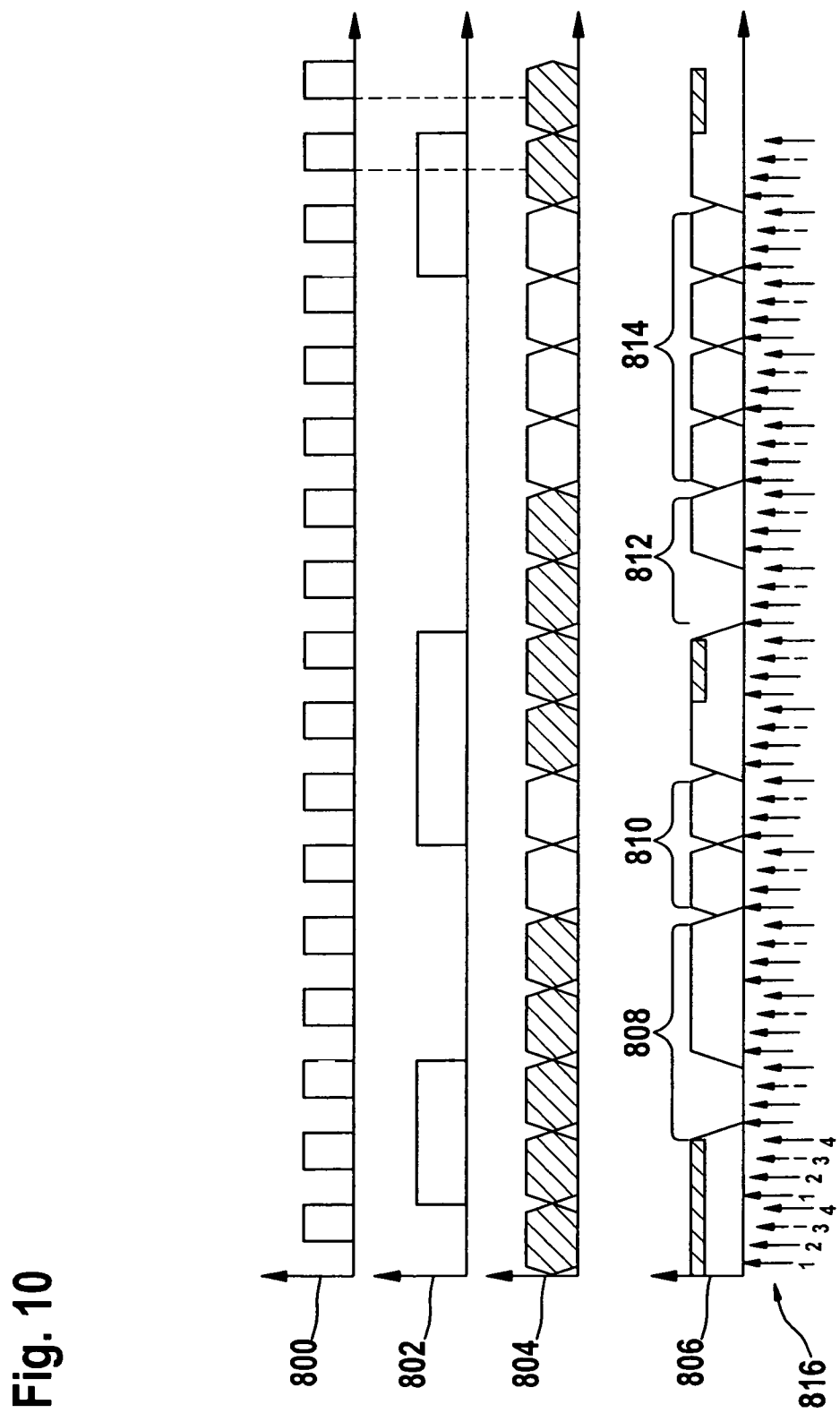
FIG. 10 shows another time sequence diagram.

FIG. 10 shows an example of a dynamic adjustment to an unknown or varying delay on the tool side.

The illustration shows a time sequence diagram having a TCK signal 800, a TMS signal 802, a TDI signal 804, and a TDO signal 806. TDO signal 806 carries a first test sequence 808, together with an associated response sequence 810 and a second test sequence 812 together with associated response sequence 814.

The clock pulse established by TCK signal 800 represents the original clock pulse of the tool. TDO signal 806 is sampled using a multiple of the clock pulse of TCK signal 800, as illustrated by arrows 816, so that test sequences 808 and 812 are rapidly recognized. After recognizing test sequences 808 and 812, TCK signal 800 may be adjusted as appropriate to ensure that response sequences 810 and 814 are reliably recognized.

In this way, multiple oversampling occurs on the TDO side; the frequency of TCK is known; therefore, phase-shifted sampling cycles are used.

Due to the known test pattern 808 or 812, the correct one out of the possible sampling points in time 1, 2, 3, 4 of sampling cycle 816 may now be selected. In the depicted diagram, for example, point in time 3 of sampling cycle 816, shown as dashed lines, is suitable for further sampling of response sequences 810 and 814. This means that response sequences 810 and 814 are analyzed from that point on at point in time 3 of sampling cycle 816. In a following response to a new input sequence 802 and 804, the selection of the correct sampling point in time 1, 2, 3, 4 is ascertained again with the aid of the test pattern. A dynamic adjustment of the sampling point in time thus occurs.

What is claimed is:

1. A method for performing bidirectional communications between a first electronic unit and at least one second electronic unit, comprising:
    transmitting from the first electronic unit to the at least second electronic unit a clock signal and an input signal synchronized with the clock signal;
    in response to the input signal, transmitting from the second electronic unit to the first electronic unit a response sequence in an output signal;
    generating and transmitting an unambiguous test sequence from the second electronic unit to the first electronic unit prior to the response sequence in the output signal, wherein a time sequence between the test sequence and the response sequence in the output signal makes it possible to take into account a time delay between the first electronic unit and the at least one second electronic unit;
    wherein the test sequence in the output signal is detected by the first electronic unit, and the response sequence in the output signal is recognized based on the detection of the test sequence, and
    wherein the output signal received in the first electronic unit is sampled using a multiple of the clock pulse.

2. The method as recited in claim 1, wherein the internal clock pulse of the first electronic unit is adjusted to the detected response sequence in the sampled output signal.

3. The method as recited in claim 2, wherein the time delay between the first electronic unit and the second electronic unit is measured.

4. The method as recited in claim 1, wherein the communications take place via a Joint Test Action Group (JTAG) interface.

5. The method as recited in claim 1, wherein the test sequence includes at least one status change.

6. An electronic system for performing bidirectional communications, comprising:
    a first electronic unit configured to transmit to the at least second electronic unit a clock signal and an input signal synchronized with the clock signal; and
    a second electronic unit configured to generate and transmit to the first electronic unit a response sequence in an output signal, in response to the input signal;
    wherein the second electronic unit further generates and transmits an unambiguous test sequence in the output signal to the first electronic unit prior to the response sequence in the output signal, wherein a time sequence between the test sequence and the response sequence in the output signal makes it possible to take into account a time delay between the first electronic unit and the at least one second electronic unit, wherein the test sequence in the output signal is detected by the first electronic unit, and the response sequence in the output signal is recognized based on the detection of the test sequence, and wherein the output signal received in the first electronic unit is sampled using a multiple of the clock pulse.

7. The system as recited in claim 6, wherein the internal clock pulse of the first electronic unit is adjusted to the detected response sequence in the sampled output signal.

8. The system as recited in claim 7, wherein the time delay between the first electronic unit and the second electronic unit is measured.

9. The system as recited in claim 6, wherein the communications take place via a Joint Test Action Group (JTAG) interface.

10. The system as recited in claim 9, wherein the test sequence includes at least one status change.

11. The system as recited in claim 6, wherein the test sequence includes at least one status change.

12. A non-transitory computer-readable medium storing a computer program, which is executable on a computer, the method comprising:
 a program code arrangement having program code for performing bidirectional communications between a first electronic unit and at least one second electronic unit, by performing the following:
 transmitting from the first electronic unit to the at least second electronic unit a clock signal and an input signal synchronized with the clock signal;
 in response to the input signal, transmitting from the second electronic unit to the first electronic unit a response sequence in an output signal; and
 generating and transmitting an unambiguous test sequence from the second electronic unit to the first electronic unit prior to the response sequence in the output signal, wherein a time sequence between the test sequence and the response sequence in the output signal makes it possible to take into account a time delay between the first electronic unit and the at least one second electronic unit;

wherein the test sequence in the output signal is detected by the first electronic unit, and the response sequence in the output signal is recognized based on the detection of the test sequence, and wherein the output signal received in the first electronic unit is sampled using a multiple of the clock pulse.

13. The computer-readable medium as recited in claim 12, wherein the internal clock pulse of the first electronic unit is adjusted to the detected response sequence in the sampled output signal.

14. The computer-readable medium as recited in claim 13, wherein the time delay between the first electronic unit and the second electronic unit is measured.

15. The computer-readable medium as recited in claim 12, wherein the test sequence includes at least one status change.

16. The computer-readable medium as recited in claim 12, wherein the communications take place via a Joint Test Action Group (JTAG) interface.

17. The computer-readable medium as recited in claim 16, wherein the test sequence includes at least one status change.

* * * * *